US008624168B2

(12) United States Patent
Gaff et al.

(10) Patent No.: US 8,624,168 B2
(45) Date of Patent: Jan. 7, 2014

(54) HEATING PLATE WITH DIODE PLANAR HEATER ZONES FOR SEMICONDUCTOR PROCESSING

(75) Inventors: Keith William Gaff, Fremont, CA (US); Keith Comendant, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 101 days.

(21) Appl. No.: 13/237,444

(22) Filed: Sep. 20, 2011

(65) Prior Publication Data
US 2013/0068750 A1  Mar. 21, 2013

(51) Int. Cl.
*H05B 3/68* (2006.01)
*H05B 3/02* (2006.01)

(52) U.S. Cl.
USPC .......... 219/444.1; 219/443.1; 219/445.1; 219/446.1; 219/447.1; 219/448.12; 219/482; 219/487

(58) Field of Classification Search
USPC ........... 219/443.1–448.12, 462.1, 482–487
See application file for complete search history.

(56) References Cited

U.S. PATENT DOCUMENTS

| | | |
|---|---|---|
| 3,440,883 A | 4/1969 | Lightner |
| 5,255,520 A | 10/1993 | O'Geary et al. |
| 5,414,245 A | 5/1995 | Hackleman |
| 5,504,471 A | 4/1996 | Lund |
| 5,515,683 A | 5/1996 | Kessler |
| 5,536,918 A | 7/1996 | Ohkase et al. |
| 5,635,093 A | 6/1997 | Arena et al. |
| 5,665,166 A | 9/1997 | Deguchi et al. |
| 5,667,622 A | 9/1997 | Hasegawa et al. |
| 5,740,016 A | 4/1998 | Dhindsa |
| 5,802,856 A | 9/1998 | Schaper et al. |
| 5,851,298 A | 12/1998 | Ishii |
| 5,886,866 A | 3/1999 | Hausmann |
| 5,994,675 A | 11/1999 | Bethune et al. |
| 6,060,697 A | 5/2000 | Morita et al. |
| 6,091,060 A | 7/2000 | Getchel et al. |
| 6,095,084 A | 8/2000 | Shamouilian et al. |

(Continued)

FOREIGN PATENT DOCUMENTS

| | | |
|---|---|---|
| JP | 2005123286 A | 5/2005 |
| JP | 2005294237 A | 10/2005 |
| KR | 20080058109 A | 6/2008 |

OTHER PUBLICATIONS

Ayars, Eric, "Bandgap in a Semiconductor Diode", Advanced and Intermediate Instructional Labs Workshop, AAPT Summer Meeting, California State university, Chicago, Jul. 20, 2008 http://phys.csuchico.edu/-eayars/publications/bandgap.pdf.

(Continued)

*Primary Examiner* — Shawntina Fuqua
(74) *Attorney, Agent, or Firm* — Buchanan Ingersoll & Rooney PC

(57) ABSTRACT

A heating plate for a substrate support assembly in a semiconductor plasma processing apparatus, comprises multiple independently controllable planar heater zones arranged in a scalable multiplexing layout, and electronics to independently control and power the planar heater zones. Each planar heater zone uses at least one diode as a heater element. A substrate support assembly in which the heating plate is incorporated includes an electrostatic clamping electrode and a temperature controlled base plate. Methods for manufacturing the heating plate include bonding together ceramic or polymer sheets having planar heater zones, power supply lines, power return lines and vias.

17 Claims, 8 Drawing Sheets

(56) References Cited

U.S. PATENT DOCUMENTS

| | | |
|---|---|---|
| 6,175,175 B1 | 1/2001 | Hull |
| 6,222,161 B1 | 4/2001 | Shirakawa et al. |
| 6,271,459 B1 | 8/2001 | Yoo |
| 6,353,209 B1 | 3/2002 | Schaper et al. |
| 6,475,336 B1 | 11/2002 | Hubacek |
| 6,512,207 B1 | 1/2003 | Dress et al. |
| 6,523,493 B1 | 2/2003 | Brcka |
| 6,566,632 B1 | 5/2003 | Katata et al. |
| 6,664,515 B2 | 12/2003 | Natsuhara et al. |
| 6,739,138 B2 | 5/2004 | Saunders et al. |
| 6,740,853 B1 | 5/2004 | Johnson et al. |
| 6,741,446 B2 | 5/2004 | Ennis |
| 6,746,616 B1 | 6/2004 | Fulford et al. |
| 6,795,292 B2 | 9/2004 | Grimard et al. |
| 6,825,617 B2 | 11/2004 | Kanno et al. |
| 6,847,014 B1 | 1/2005 | Benjamin et al. |
| 6,886,347 B2 | 5/2005 | Hudson et al. |
| 6,921,724 B2 | 7/2005 | Kamp et al. |
| 7,075,031 B2 | 7/2006 | Strang et al. |
| 7,141,763 B2 | 11/2006 | Moroz |
| 7,175,714 B2 | 2/2007 | Ootsuka et al. |
| 7,230,204 B2 | 6/2007 | Mitrovic et al. |
| 7,268,322 B2 | 9/2007 | Kuibira et al. |
| 7,274,004 B2 | 9/2007 | Benjamin et al. |
| 7,275,309 B2 | 10/2007 | Matsuda et al. |
| 7,279,661 B2 | 10/2007 | Okajima et al. |
| 7,297,894 B1 | 11/2007 | Tsukamoto |
| 7,311,782 B2 | 12/2007 | Strang et al. |
| 7,372,001 B2 | 5/2008 | Tachikawa et al. |
| 7,396,431 B2 | 7/2008 | Chen et al. |
| 7,415,312 B2 | 8/2008 | Barnett, Jr. et al. |
| 7,475,551 B2 | 1/2009 | Ghoshal |
| 7,504,006 B2 | 3/2009 | Gopalraja et al. |
| 7,782,583 B2 | 8/2010 | Moon |
| 7,893,387 B2 | 2/2011 | Ohata |
| 7,940,064 B2 | 5/2011 | Segawa et al. |
| 7,952,049 B2 | 5/2011 | Tsukamoto |
| 7,968,825 B2 | 6/2011 | Jyousaka et al. |
| 8,057,602 B2 | 11/2011 | Koelmel et al. |
| 8,222,574 B2 | 7/2012 | Sorabji et al. |
| 2002/0043528 A1 | 4/2002 | Ito |
| 2005/0016465 A1 | 1/2005 | Ramaswamy et al. |
| 2005/0215073 A1 | 9/2005 | Nakamura et al. |
| 2005/0229854 A1 | 10/2005 | Moroz |
| 2006/0191637 A1 | 8/2006 | Zajac et al. |
| 2007/0125762 A1 | 6/2007 | Cui et al. |
| 2008/0029195 A1 | 2/2008 | Lu |
| 2008/0049374 A1 | 2/2008 | Morioka et al. |
| 2008/0169282 A1* | 7/2008 | Sorabji et al. ............... 219/444.1 |
| 2008/0202924 A1 | 8/2008 | Bluck et al. |
| 2009/0000738 A1 | 1/2009 | Benjamin |
| 2009/0173445 A1 | 7/2009 | Yeom et al. |
| 2009/0183677 A1 | 7/2009 | Tian et al. |
| 2009/0215201 A1 | 8/2009 | Benjamin et al. |
| 2010/0078424 A1 | 4/2010 | Tsukamoto et al. |
| 2010/0257871 A1 | 10/2010 | Venkatasubramanian et al. |
| 2010/0283565 A1 | 11/2010 | Blakes |
| 2011/0005682 A1 | 1/2011 | Savas et al. |
| 2011/0033175 A1 | 2/2011 | Kasai et al. |
| 2011/0092072 A1* | 4/2011 | Singh et al. ................... 438/710 |
| 2011/0143462 A1 | 6/2011 | Gaff et al. |

OTHER PUBLICATIONS

International Search Report and Written Opinion mailed Jan. 22, 2013 for PCT/IB2012/054911.
Commonly-Owned U.S. Appl. No. 12/910,347, filed Oct. 22, 2010.
Commonly-Owned U.S. Appl. No. 12/943,492, filed Nov. 10, 2010.
Commonly-Owned U.S. Appl. No. 13/238,396, filed Sep. 21, 2011.
Commonly-Owned U.S. Appl. No. 13/234,473, filed Sep. 16, 2011.

* cited by examiner

HEATING PLATE WITH DIODE PLANAR HEATER ZONES FOR SEMICONDUCTOR PROCESSING

BACKGROUND

With each successive semiconductor technology generation, substrate diameters tend to increase and transistor sizes decrease, resulting in the need for an ever higher degree of accuracy and repeatability in substrate processing. Semiconductor substrate materials, such as silicon substrates, are processed by techniques which include the use of vacuum chambers. These techniques include non plasma applications such as electron beam deposition, as well as plasma applications, such as sputter deposition, plasma-enhanced chemical vapor deposition (PECVD), resist strip, and plasma etch.

Plasma processing systems available today are among those semiconductor fabrication tools which are subject to an increasing need for improved accuracy and repeatability. One metric for plasma processing systems is increased uniformity, which includes uniformity of process results on a semiconductor substrate surface as well as uniformity of process results of a succession of substrates processed with nominally the same input parameters. Continuous improvement of on-substrate uniformity is desirable. Among other things, this calls for plasma chambers with improved uniformity, consistency and self diagnostics.

SUMMARY

Described herein is a heating plate for a substrate support assembly used to support a semiconductor substrate in a semiconductor processing apparatus, the heating plate comprising: an electrically insulating layer; planar heater zones comprising at least first, second, third and fourth planar heater zones, each comprising one or more diodes as heater elements, the planar heater zones laterally distributed across the electrically insulating layer and operable to tune a spatial temperature profile on the semiconductor substrate; power supply lines comprising at least a first electrically conductive power supply line electrically connected to anodes of the one or more diodes of the first and second planar heater zones and a second electrically conductive power supply line electrically connected to anodes of the one or more diodes of the third and fourth planar heater zones; power return lines comprising at least a first electrically conductive power return line electrically connected to cathodes of the one or more diodes of the first and third planar heater zones and a second electrically conductive power return line electrically connected to cathodes of the one or more diodes of the second and fourth planar heater zones.

DETAILED DESCRIPTION

Figure 1:
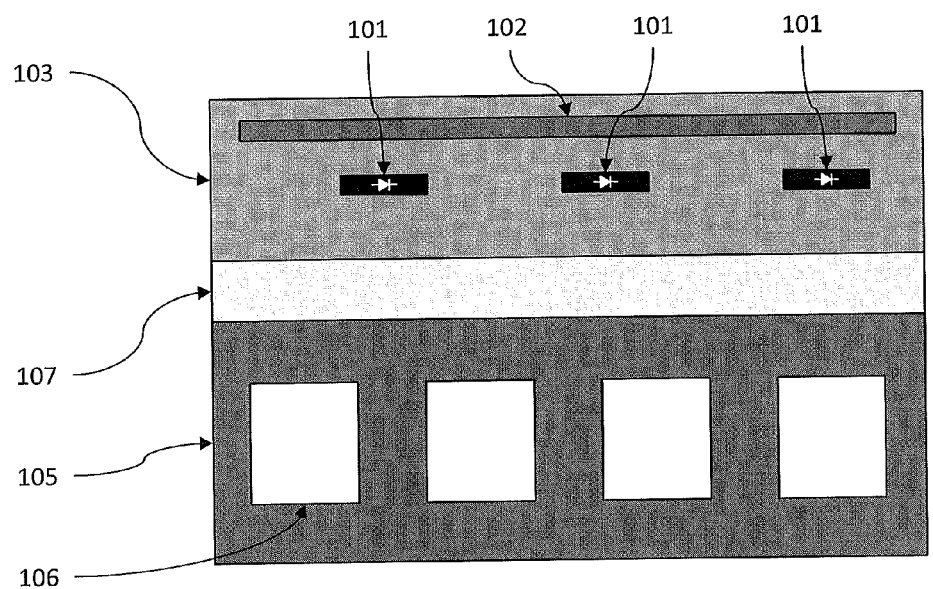
FIG. 1 is a schematic cross-sectional view of a substrate support assembly in which a heating plate with an array of planar heater zones is incorporated, the substrate support assembly also comprising an electrostatic chuck (ESC).

Radial and azimuthal substrate temperature control in a semiconductor processing apparatus to achieve desired critical dimension (CD) uniformity on the substrate is becoming more demanding. Even a small variation of temperature may affect CD to an unacceptable degree, especially as CD approaches sub-100 nm in semiconductor fabrication processes.

A substrate support assembly may be configured for a variety of functions during processing, such as supporting the substrate, tuning the substrate temperature, and supplying radio frequency power. The substrate support assembly can comprise an electrostatic chuck (ESC) useful for electrostatically clamping a substrate onto the substrate support assembly during processing. The ESC may be a tunable ESC (T-ESC). A T-ESC is described in commonly assigned U.S. Pat. Nos. 6,847,014 and 6,921,724, which are hereby incorporated by reference. The substrate support assembly may comprise a ceramic substrate holder, a fluid-cooled heat sink (hereafter referred to as cooling plate) and a plurality of concentric planar heater zones to realize step by step and radial temperature control. Typically, the cooling plate is maintained between 0° C. and 30° C. The heaters are located on the cooling plate with a layer of thermal insulator in between. The heaters can maintain the support surface of the substrate support assembly at temperatures about 0° C. to 80° C. above the cooling plate temperature. By changing the heater power within the plurality of planar heater zones, the substrate support temperature profile can be changed. Further, the mean substrate support temperature can be changed step by step within the operating range of 0 to 80° C. above the cooling plate temperature. A small azimuthal temperature variation poses increasingly greater challenges as CD decreases with the advance of semiconductor technology.

Controlling temperature is not an easy task for several reasons. First, many factors can affect heat transfer, such as the locations of heat sources and heat sinks, the movement, materials and shapes of the media. Second, heat transfer is a dynamic process. Unless the system in question is in heat equilibrium, heat transfer will occur and the temperature profile and heat transfer will change with time. Third, non-equilibrium phenomena, such as plasma, which of course is always present in plasma processing, make theoretical prediction of the heat transfer behavior of any practical plasma processing apparatus very difficult if not impossible.

The substrate temperature profile in a plasma processing apparatus is affected by many factors, such as the plasma density profile, the RF power profile and the detailed structure of the various heating the cooling elements in the chuck, hence the substrate temperature profile is often not uniform and difficult to control with a small number of heating or cooling elements. This deficiency translates to non-uniformity in the processing rate across the whole substrate and non-uniformity in the critical dimension of the device dies on the substrate.

In light of the complex nature of temperature control, it would be advantageous to incorporate multiple independently controllable planar heater zones in the substrate support assembly to enable the apparatus to actively create and maintain the desired spatial and temporal temperature profile, and to compensate for other adverse factors that affect CD uniformity.

Described herein is a heating plate for a substrate support assembly in a semiconductor processing apparatus, wherein the heating plate has multiple independently controllable planar heater zones that use diodes as heater elements therein. Preferably, the planar heater zones do not have resistive heater elements. This heating plate comprises a scalable multiplexing layout scheme of the planar heater zones, power supply lines and power return lines (collectively, power lines). By tuning the power of the planar heater zones, the temperature profile during processing can be shaped both radially and azimuthally. More details are disclosed in commonly-owned U.S. Published Patent Publication Nos. 2011/0092072 and 2011/0143462, the disclosures of which are hereby incorporated by reference. Although this heating plate is primarily described for a plasma processing apparatus, this heating plate can also be used in other semiconductor processing apparatuses that do not use plasma.

The planar heater zones in this heating plate are preferably arranged in a defined pattern, for example, a rectangular grid, a hexagonal grid, a polar array, concentric rings or any desired pattern. Each planar heater zone may be of any suitable size and may have one or more heater elements. When a planar heater zone is powered, all heater elements therein are powered; when a planar heater zone is not powered, all heater elements therein are not powered. To minimize the number of electrical connections, power supply lines and power return lines are arranged such that each power supply line is connected to a different group of planar heater zones and each power return line is connected to a different group of planar heater zones, each planar heater zone being in one of the groups connected to a particular power supply line and one of the groups connected to a particular power return line. No two planar heater zones are connected to the same pair of power supply and power return lines. Anode(s) of the heater element(s) of each planar heater zone are connected to the power supply line this planar heater zone is connected to; cathode(s) of the heater element(s) are connected to the power return line this planar heater zone is connected to. A planar heater zone can be activated by directing DC electrical current through a pair of power supply line and power return line to which this particular planar heater zone is connected. The DC electrical current flows from the power supply line to the planar heater zone and then to the power return line. The peak power of the heater elements is preferably smaller than 20 W, more preferably 1 to 10 W. In one embodiment, each planar heater zone is not larger than four device dies being manufactured on a semiconductor substrate, or not larger than two device dies being manufactured on a semiconductor substrate, or not larger than one device die being manufactured on a semiconductor substrate, 0.1 to 15 cm$^2$, e.g., 0.1 to 1 cm$^2$ or 2 to 3 cm$^2$ in area to correspond to the device dies on the substrate. The heating plate can include any suitable number of planar heater zones, such as 100 to 700 planar heater zones. The thickness of the heater elements may range from 100 micrometers to 2 millimeters. To allow space between planar heater zones and/or power supply and power return lines, the total area of the planar heater zones may be up to 99% of the area of the upper surface of the substrate support assembly, e.g. 50-99% of the area. The power supply lines or the power return lines may be arranged in gaps ranging from 1 to 10 mm between the planar heater zones, or in separate planes separated from the planar heater zones plane by electrically insulating layers. The power supply lines and the power return lines are preferably made as wide as the space allows, in order to carry large current and reduce Joule heating. In one embodiment, in which the power lines are in the same plane as the planar heater zones, the width of the power lines is preferably between 0.3 mm and 2 mm. In another embodiment, in which the power lines are on different planes than the planar heater zones, the width of the power lines can be as large as the planar heater zones, e.g. for a 300 mm chuck, the width can be 1 to 2 inches. Preferably, the materials of the power supply lines and power return lines are materials with low resistivity, such as Cu, Al, W, Inconel® or Mo.

Conventional resistive heater elements typically comprise serpentine conductor traces, which limits miniaturization of the planar heater zones, especially when planar heater zones no larger than 5 mm by 5 mm are desired. In addition, the serpentine conductor traces cannot occupy the entire area of a planar heater zone. Spaces between the serpentine conductor traces can lead to significant temperature non-uniformity within a planar heater zone, especially when the planar heater zone is small. In comparison, using diodes as heater elements in the planar heater zones alleviates the above-mentioned problems associated with resistive heater elements because a diode can be made into a continuous sheet of essentially the same size as the planar heater zone. The heating plate with planar heater zones using diodes as heater elements has greater flexibility in its design, is simpler in its structure, and can lead to better temperature uniformity within each planar heater zone.

FIG. 1 shows a substrate support assembly comprising one embodiment of the heating plate having an electrically insulating layer 103. The layer 103 may have one or more layers made of a polymer material, an inorganic material, a ceramic such as silicon oxide, alumina, yttria, aluminum nitride or other suitable material. The substrate support assembly further comprises (a) at least one ESC (electrostatic clamping) electrode 102 (e.g. monopolar or bipolar) embedded in the layer 103 to electrostatically clamp a substrate to the surface of the layer 103 with a DC voltage, (b) a thermal barrier layer 107, (c) a cooling plate 105 containing channels 106 for coolant flow. The power supply lines and power return lines are not shown for clarity.

Figure 2:
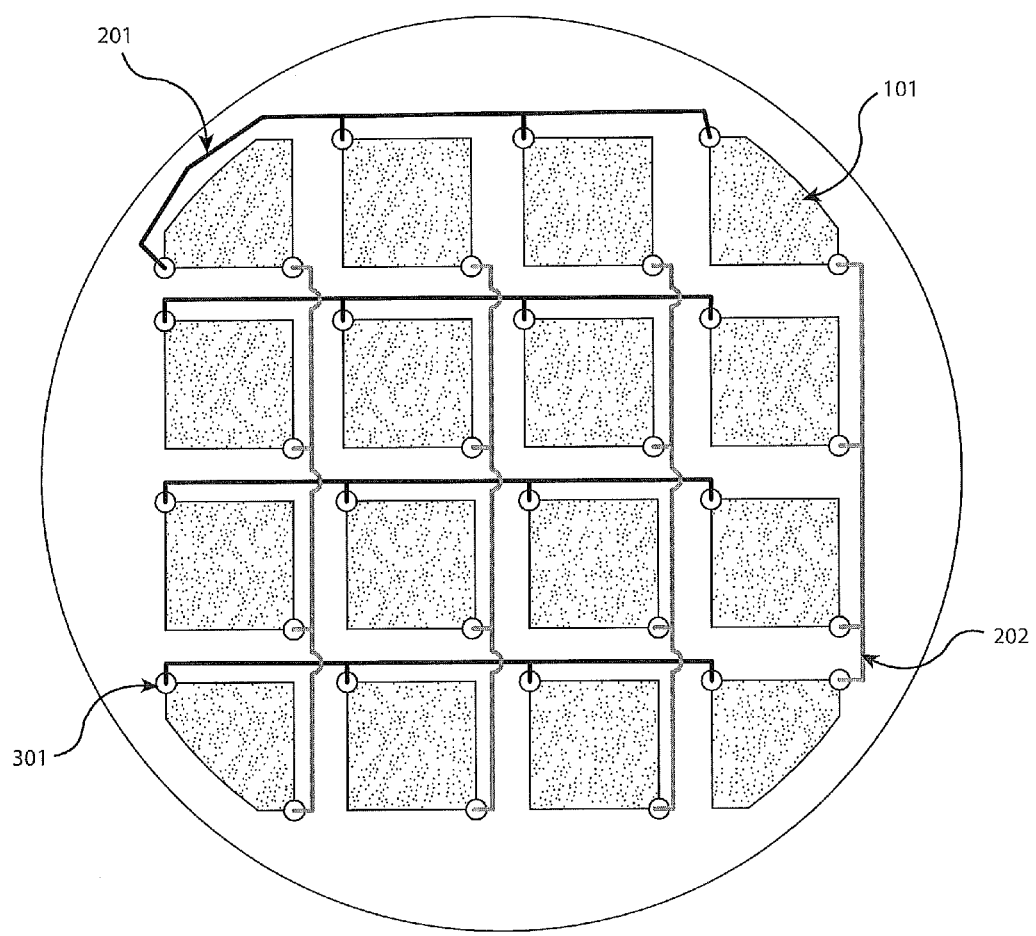
FIG. 2 illustrates the electrical connection of power supply lines and power return lines to an array of planar heater zones in a heating plate which can be incorporated in a substrate support assembly.

As shown in FIG. 2, each of the planar heater zones 101 is connected to one of the power supply lines 201 and one of the power return lines 202. No two planar heater zones 101 share the same pair of power supply 201 and power return 202 lines. By suitable electrical switching arrangements, it is possible to connect a pair of power supply line 201 and power return line 202 to a power supply (not shown), whereby only the planar heater zone connected to this pair of power lines is powered. The time-averaged heating power of each planar heater zone can be individually tuned by time-domain multiplexing.

Figure 3:
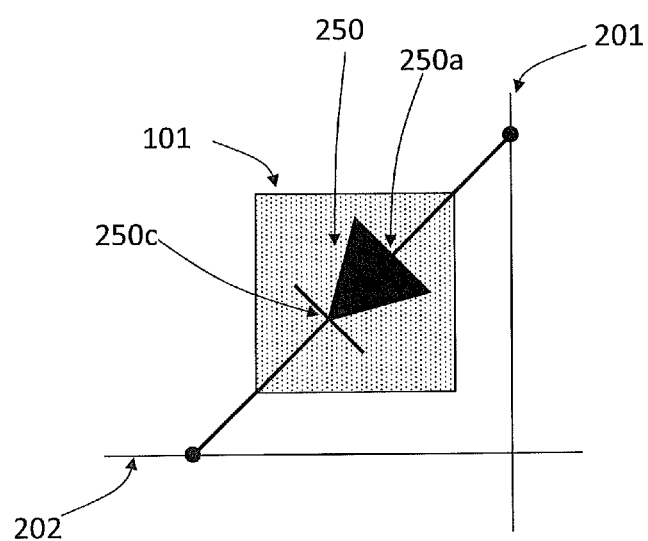
FIG. 3 illustrates the electrical connection between a diode as a heater element in a planar heater zone to a power supply line and a power return line.

FIG. 3 shows details of connections of a planar heater zone 101 to a pair of power supply line 201 and power return line 202. The planar heater zone 101 has one or more diodes 250 as its heater elements. The anode 250a of the diode 250 is connected to the power supply line 201 and the cathode 250c of the diode 250 is connected to the power return line 202.

Figure 4:
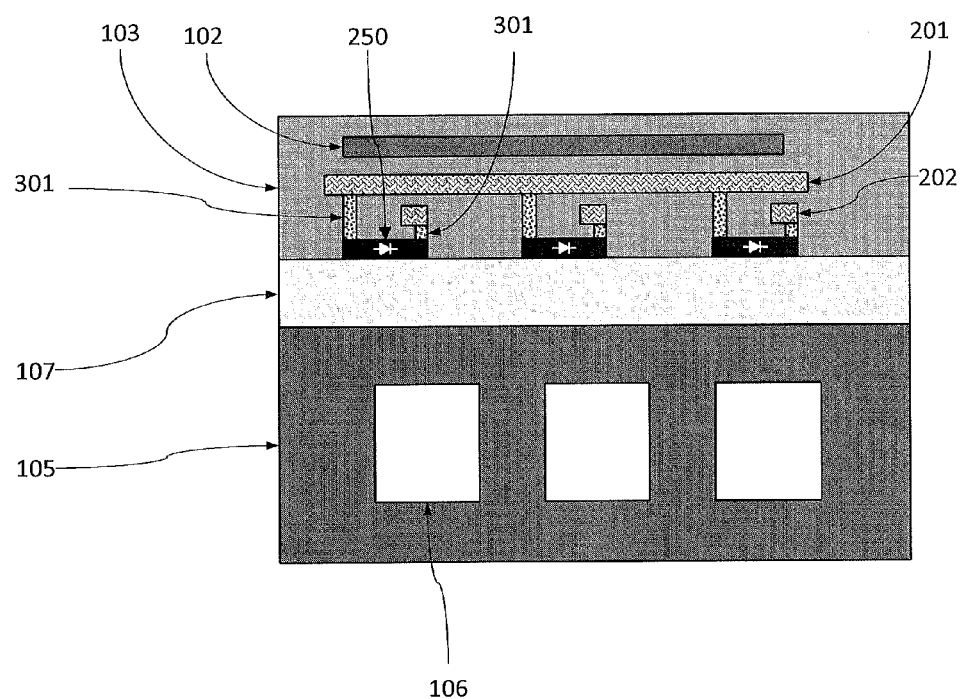
FIG. 4 is a schematic cross-sectional view of a substrate support assembly in which a heating plate is incorporated, according to an embodiment.
Figure 5:
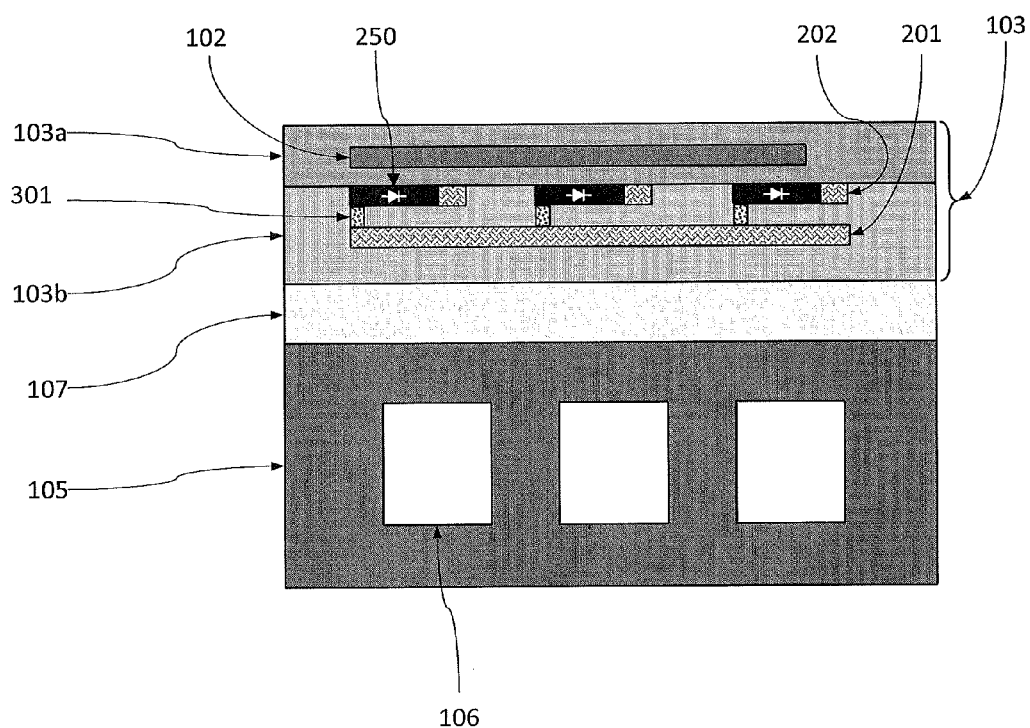
FIG. 5 is a schematic cross-sectional view of a substrate support assembly in which a heating plate is incorporated, according to an embodiment.
Figure 6:
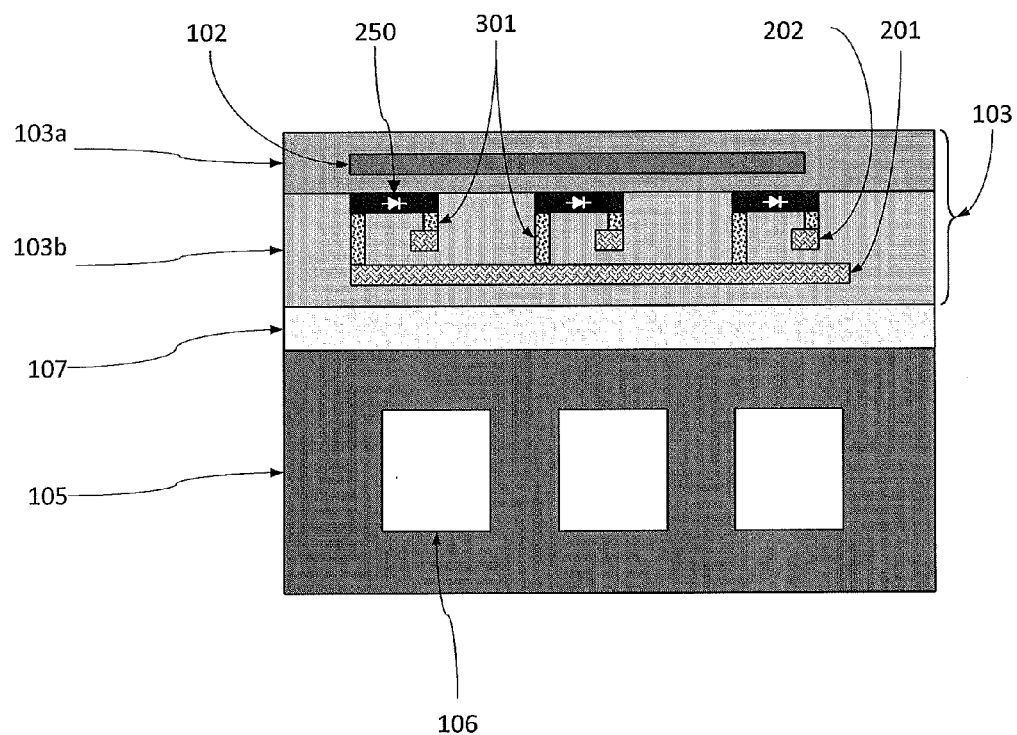
FIG. 6 is a schematic cross-sectional view of a substrate support assembly in which a heating plate is incorporated, according to an embodiment.

FIGS. 4-6 show embodiments of a heating plate comprising an electrically insulating layer, planar heater zones comprising one or more diodes as heater elements, power supply lines and power return lines. The heating plate can be incorporated in a substrate support assembly comprising an electrostatic chuck above the heating plate and a cooling plate located below the heating plate.

FIG. 4 shows an arrangement of the power supply lines 201 and power return lines 202 in the substrate support assembly of FIG. 1, according to an embodiment. The diodes 250 of the planar heater zones are bonded to a bottom surface of the layer 103 and electrically connected to the power supply lines 201 and the power return lines 202 embedded in the layer 103 through vias 301 extending vertically in the layer 103. Preferably, the power supply lines 201 and power return lines 202 are not in the same plane.

FIG. 5 shows an arrangement of the power supply lines 201 and power return lines 202 in the substrate support assembly of FIG. 1, according to another embodiment. The layer 103 includes an upper layer 103a and a lower layer 103b. The ESC electrode 102 is embedded in the upper layer 103a. The diodes 250 are bonded to an upper surface of the lower layer 103b. The power return lines 202 are disposed on the upper surface of the lower layer 103b. The power supply lines 201 are embedded in the lower layer 103b. The diodes 250 are electrically connected to the power supply lines 201 through vertically extending vias 301. The diodes 250 are electrically connected laterally to the power return line 202. The lower layer 103b is sandwiched between the upper layer 103a and the thermal barrier layer 107.

FIG. 6 shows an arrangement of the power supply lines 201 and power return lines 202 in the substrate support assembly of FIG. 1, according to another embodiment. The layer 103 includes an upper layer 103a and a lower layer 103b. The ESC electrode 102 is embedded in the upper layer 103a. The diodes 250 are bonded to an upper surface of the lower layer 103. The power supply lines 201 and power return lines 202 are embedded in the lower layer 103, preferably not on the same plane. The diodes 250 are electrically connected to the power supply lines 201 and power return lines 202 through vias 301 extending vertically in the lower layer 103b. The lower layer 103b is sandwiched between the upper layer 103a and the thermal barrier layer 107.

The layer 103 is preferably made of ceramic. The heating plate as shown in FIGS. 4-6 can be made by an exemplary method comprising: pressing a mixture of ceramic powder, binder and liquid into sheets; drying the sheets; forming vias in the sheets by punching holes in the sheets; forming power supply lines and power return lines on the sheets by screen printing a slurry of conducting powder (e.g. W, WC, doped SiC or $MoSi_2$), pressing a precut metal foil, spraying a slurry of conducting powder, or any other suitable technique; aligning the sheets; bonding the sheets by adhesive or sintering to form the layer 103; filling the vias with a slurry of conducting powder; bonding diodes onto a lower surface of the layer 103 such that diodes in each planar heater zone are connected to a pair of power supply line and power return line and no two diodes in different planar heater zones share the same pair of power supply line and power return line. The sheets can be about 0.3 mm in thickness.

The heating plate as shown in FIGS. 4-6 can also be made by another method comprising: (a) bonding (e.g. heat pressed, adhered with adhesive) a metal sheet (such as Al, Inconel® or Cu foil) onto a fiberglass composite plate, or a metal plate covered by an electrically insulating polymer film (e.g. polyimide); (b) applying a patterned resist film to the surface of the metal sheet wherein the openings in the patterned resist film define the shapes and positions of a group of power lines; (c) forming the group of power lines by chemically etching portions of the metal sheet exposed through the openings in the patterned resist film; (d) removing the resist film (by dissolution in a suitable solvent or dry stripping); (e) applying an electrically insulating polymer film on the metal sheet; (f) optionally repeat steps (b)-(e) one or more times; (g) forming vias by punching holes through the metal sheet(s) and the electrically insulating polymer film(s) and filling the holes with a slurry of conducting powder; (h) bonding diodes, and optionally forming a group of power lines, onto an exposed surface of the topmost electrically insulating polymer such that diodes in each planar heater zone are connected to a pair of a power supply line and a power return line, and that no two diodes in different planar heater zones share the same pair of power supply line and power return line.

The diodes 250 can be any suitable model such as CPD07 manufactured by Central Semiconductor located at Hauppauge, N.Y. An exemplary diode 250 has a dimension of about 2.5 mm by 2.5 mm, can carry an electrical current up to 8 A, and has a heating power up to 10 W. The diode 250 preferably has a heating power density of at least 0.1 W/cm$^2$ and is sufficient to achieve a 2° C. temperature perturbation. The thermal insulating layer 107 preferably has a thermal resistance from about 0.01 to about 100 m$^2$K/W (e.g. about 1 m$^2$K/W).

When powering a planar heater zone 101, a DC electrical current is directed through the diode(s) 250 in the heater zone 101, in a direction from the anode(s) of the diode(s) 250 to the cathode(s) of the diode(s) 250.

Figure 7:
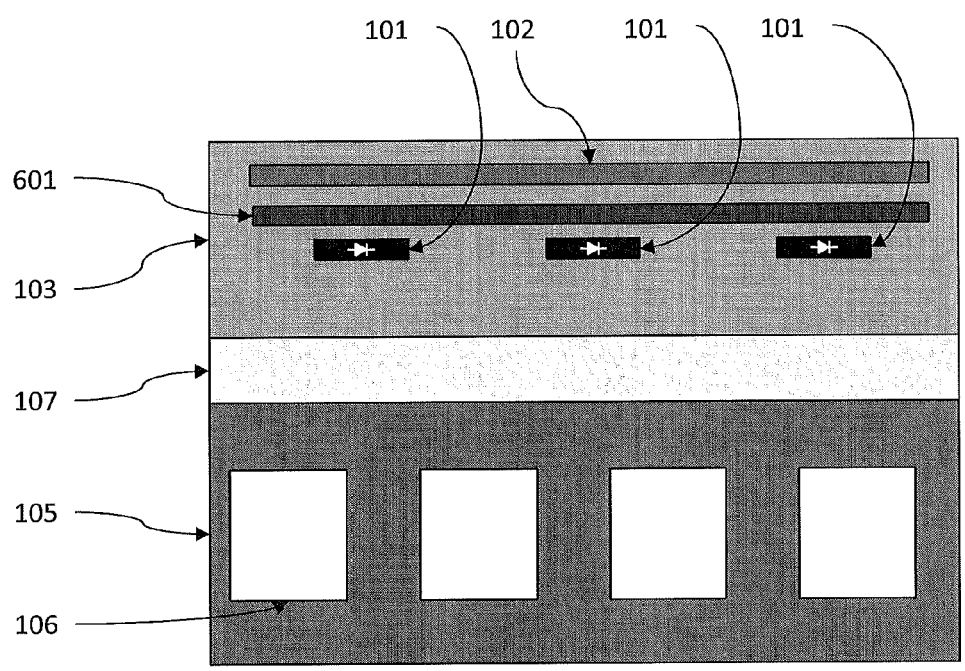
FIG. 7 is a schematic cross-sectional view of a substrate support assembly in which a heating plate is incorporated, the substrate support assembly further including a primary heater layer.

FIG. 7 shows the substrate support assembly of FIG. 1, further comprising the primary heater layer 601. Preferably, the primary heaters 601 are individually controlled high-power heaters. The power of the primary heaters is between 100 and 1,0000 W, preferably, between 1,000 and 5,000 W. The primary heaters may be arranged as a rectangular grid, concentric annular zones, radial zone or combination of annular zones and radial zones. The primary heaters may be used for changing the mean temperature, tuning the radial temperature profile, or step-by-step temperature control on the substrate. The primary heaters may be located above or below the heater zones of the heating plate.

Figure 8:
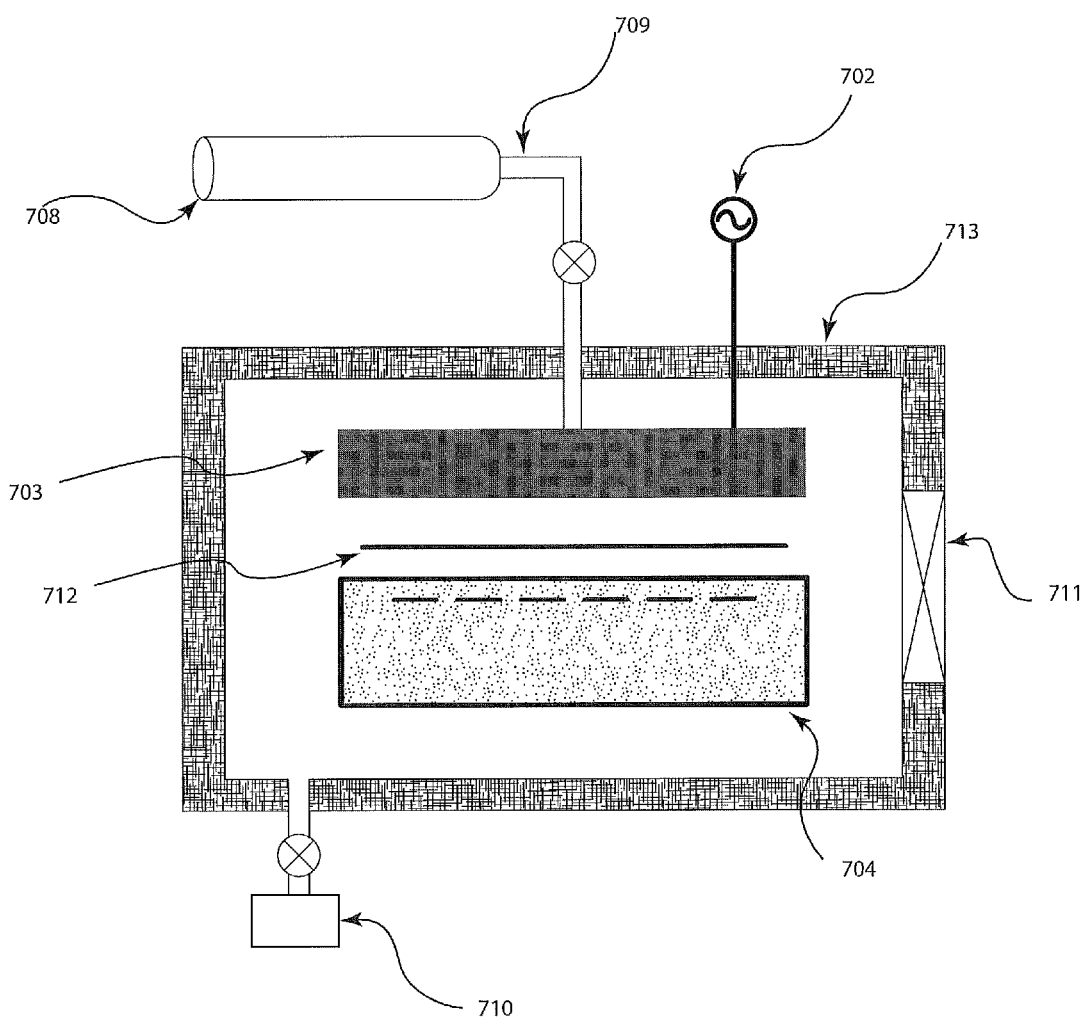
FIG. 8 is a schematic of an exemplary plasma processing chamber, which can include a substrate support assembly with the heating plate described herein.

As an overview of how a plasma processing chamber operates, FIG. 8 shows a schematic of a plasma processing chamber comprising a chamber 713 having an upper showerhead electrode 703 and a substrate support assembly 704 incorporating the heating plate disclosed herein. A substrate 712 is loaded through a loading port 711 onto the substrate support assembly 704. A gas line 709 supplies process gas to the upper showerhead electrode 703 which delivers the process gas into the chamber. A gas source 708 (e.g. a mass flow controller supplying a suitable gas mixture) is connected to the gas line 709. A RF power source 702 is connected to the upper showerhead electrode 703. In operation, the chamber is evacuated by a vacuum pump 710 and the RF power is capacitively coupled between the upper showerhead electrode 703 and a lower electrode in the substrate support assembly 704 to energize the process gas into a plasma in the space between the substrate 712 and the upper showerhead electrode 703. The plasma can be used to etch device die features into layers on the substrate 712. The substrate support assembly 704 may have heaters incorporated therein. As described above, it should be appreciated that while the detailed design of the plasma processing chamber may vary, RF power is coupled to the plasma through the substrate support assembly 704.

Examples of suitable insulating and conductive material for use in manufacture of the substrate support assembly are disclosed in commonly assigned U.S. Pat. No. 6,483,690, the disclosure of which is hereby incorporated by reference.

While a heating plate, methods of manufacturing the heating plate, and a substrate support assembly comprising the heating plate have been described in detail with reference to specific embodiments thereof, it will be apparent to those skilled in the art that various changes and modifications can be made, and equivalents employed, without departing from the scope of the appended claims.

We claim:

1. A heating plate for a substrate support assembly used to support a semiconductor substrate in a semiconductor processing apparatus, the heating plate comprising:

an electrically insulating layer comprising upper and lower electrically insulating layers;

planar heater zones comprising at least first, second, third and fourth planar heater zones, each comprising one or more diodes as heater elements, the planar heater zones located between the upper and lower electrically insulating layers, laterally distributed across the electrically insulating layer and operable to tune a spatial temperature profile on the semiconductor substrate;

power supply lines comprising at least a first electrically conductive power supply line electrically connected to anodes of the one or more diodes of the first and second planar heater zones and a second electrically conductive power supply line electrically connected to anodes of the one or more diodes of the third and fourth planar heater zones;

power return lines comprising at least a first electrically conductive power return line electrically connected to cathodes of the one or more diodes of the first and third planar heater zones and a second electrically conductive power return line electrically connected to cathodes of the one or more diodes of the second and fourth planar heater zones.

2. The heating plate of claim 1, wherein the planar heater zones do not comprise any resistive heater elements.

3. The heating plate of claim 1, wherein
   (a) the power supply lines and the power return lines are embedded in the electrically insulating layer; the diodes of the planar heater zones are bonded to an upper surface of the lower electrically insulating layer; the power supply lines and the power return lines are electrically connected to the planar heater zones by vias extending vertically through the heating plate; or
   (b) the power supply lines are embedded in the electrically insulating layer; the power return lines are on an upper surface of the electrically insulating layer; the diodes of the planar heater zones are bonded to the upper surface of the lower electrically insulating layer; the power return lines are electrically connected to the planar heater zones laterally and the power supply lines are electrically connected to the planar heater zones by vias extending vertically through the heating plate.

4. The heating plate of claim 1, wherein the planar heater zones are sized such that:
   (a) each planar heater zone is not larger than four device dies being manufactured on the semiconductor substrate, or
   (b) each planar heater zone is not larger than two device dies being manufactured on the semiconductor substrate, or
   (c) each planar heater zone is not larger than one device die being manufactured on the semiconductor substrate, or
   (d) each planar heater zone is scaled with sizes of device dies on the semiconductor substrate and the overall size of the semiconductor substrate.

5. The heating plate of claim 1, wherein the planar heater zones are sized such that:
   (a) each planar heater zone is 0.1 to 1 $cm^2$, or
   (b) each planar heater zone is 2 to 3 $cm^2$, or
   (c) each planar heater zone is 1 to 15 $cm^2$.

6. The heating plate of claim 1, wherein the heating plate includes 100 to 700 planar heater zones.

7. The heating plate of claim 1, wherein the electrically insulating layer comprises a polymer material, a ceramic material, a fiberglass composite, or a combination thereof.

8. The heating plate of claim 1, wherein the total number of the power supply lines and the power return lines is equal to or less than the total number of the planar heater zones.

9. The heating plate of claim 1, wherein a total area of the planar heater zones is from 50% to 99% of an upper surface of the heating plate.

10. The heating plate of claim 1, wherein the planar heater zones are arranged in a rectangular grid, hexagonal grid or concentric rings; and the planar heater zones are separated from each other by gaps at least 1 millimeter in width and at most 10 millimeters in width.

11. A substrate support assembly comprising:

an electrostatic chuck (ESC) including at least one electrostatic clamping electrode configured to electrostatically clamp a semiconductor substrate on the substrate support assembly;

the heating plate of claim 1; and a cooling plate attached to a lower side of the heating plate by a thermal barrier layer.

12. The substrate support assembly of claim 11, further comprising at least one primary heater layer arranged above or below and the planar heater zones of the heating plate, wherein the primary heater layer is electrically insulated from the planar heater zones, the power supply lines, and the power return lines of the heating plate; the primary heater layer includes at least one heater which provides mean temperature control of the semiconductor substrate; the planar heater zones provide radial and azimuthal temperature profile control of the semiconductor substrate, during processing thereof.

13. A method for manufacturing the heating plate of claim 1, comprising:

pressing a mixture of ceramic powder, binder and liquid into sheets;

drying the sheets;

forming vias in the sheets by punching holes therein;

forming the power supply lines and power return lines on the sheets;

aligning the sheets;

bonding the sheets by adhesive or sintering to form the upper sheet of the electrically insulating layer;

filling the vias with a slurry of conducting powder;

bonding diodes onto a lower surface of the upper sheet of the electrically insulating layer such that diode(s) in each planar heater zone are connected to a pair of power supply line and power return line and no two diodes in different planar heater zones share the same pair of power supply line and power return line.

14. The method of claim 13, wherein the power supply lines and power return lines are formed by screen printing a slurry of conducting powder, pressing a precut metal foil, or spraying a slurry of conducting powder.

15. A method for manufacturing the heating plate of claim 1, comprising:

(a) bonding a metal sheet onto a fiberglass composite plate, or a metal plate covered by an electrically insulating polymer film;
(b) applying a patterned resist film to the surface of the metal sheet wherein the openings in the patterned resist film define the shapes and positions of a group of power lines;
(c) forming the group of power lines by chemically etching portions of the metal sheet exposed through the openings in the patterned resist film;
(d) removing the resist film;
(e) applying an electrically insulating polymer film on the metal sheet;
(f) optionally repeat steps (b)-(e) one or more times to form the lower layer of the electrically insulating layer;
(g) forming vias by punching holes through the metal sheet(s) and the electrically insulating polymer film(s) and filling the holes with a slurry of conducting powder;
(h) bonding diodes, and optionally forming a group of power lines, onto an exposed surface of the topmost electrically insulating polymer film such that diodes in each planar heater zone are connected to a pair of a power supply line and a power return line, and that no two diodes in different planar heater zones share the same pair of power supply line and power return line.

16. A method for plasma processing semiconductor substrates in a plasma processing chamber containing the substrate support assembly of claim 11, comprising:
(a) loading a semiconductor substrate into the processing chamber and positioning the semiconductor substrate on the substrate support assembly;
(b) determining a temperature profile that compensates for processing conditions affecting critical dimension (CD) uniformity;
(c) heating the semiconductor substrate to conform to the temperature profile using the substrate support assembly;
(d) igniting plasma and processing the semiconductor substrate while controlling the temperature profile by independently controlled heating of the planar heater zones;
(e) unloading the semiconductor substrate from the processing chamber and repeating steps (a)-(e) with a different semiconductor substrate.

17. The substrate support assembly of claim 12, wherein the primary heater layer includes two or more heaters.

* * * * *